(12) United States Patent
Byun et al.

(10) Patent No.: US 8,304,876 B2
(45) Date of Patent: Nov. 6, 2012

(54) SEMICONDUCTOR PACKAGE AND METHOD FOR MANUFACTURING THE SAME

(75) Inventors: Hak-Kyoon Byun, Asan-si (KR);
Taehoon Kim, Cheonan-si (KR);
Jongkook Kim, Hwaseong-si (KR);
Sang-Uk Han, Hwaseong-si (KR);
Jung-Do Lee, Uiwang-si (KR);
Seonhyang You, Daejeon (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 510 days.

(21) Appl. No.: 12/461,456

(22) Filed: Aug. 12, 2009

(65) Prior Publication Data

US 2010/0038765 A1    Feb. 18, 2010

(30) Foreign Application Priority Data

Aug. 13, 2008  (KR) .................. 10-2008-0079573

(51) Int. Cl.
*H01L 25/11* (2006.01)
(52) U.S. Cl. .. 257/686; 257/678; 257/685; 257/E25.027
(58) Field of Classification Search .................. 257/678, 257/685, 686
See application file for complete search history.

(56) References Cited

U.S. PATENT DOCUMENTS

| 7,291,906 | B2 | 11/2007 | Cha et al. | |
| 7,560,807 | B2 * | 7/2009 | Ruckerbauer et al. | 257/686 |
| 7,595,550 | B2 * | 9/2009 | Cady et al. | 257/685 |
| 7,719,098 | B2 * | 5/2010 | Wehrly, Jr. | 257/686 |
| 7,888,185 | B2 * | 2/2011 | Corisis et al. | 438/123 |
| 2004/0150107 | A1 * | 8/2004 | Cha et al. | 257/738 |

FOREIGN PATENT DOCUMENTS

| KR | 10-2002-0028473 | 4/2002 |
| KR | 10-2005-0080769 | 8/2005 |
| KR | 10-0625186 | 9/2006 |

* cited by examiner

*Primary Examiner* — Matthew W Such
*Assistant Examiner* — David Spalla
(74) *Attorney, Agent, or Firm* — Harness, Dickey & Pierce, P.L.C.

(57) ABSTRACT

Provided is a semiconductor package and a method for fabricating the semiconductor package. The semiconductor package may include a first package having a first semiconductor chip mounted on a first substrate and a second package having a second semiconductor chip mounted on a second substrate, the second substrate being bent to cover a side of the first package to contact the first substrate such that the first and second packages are connected electrically.

13 Claims, 19 Drawing Sheets

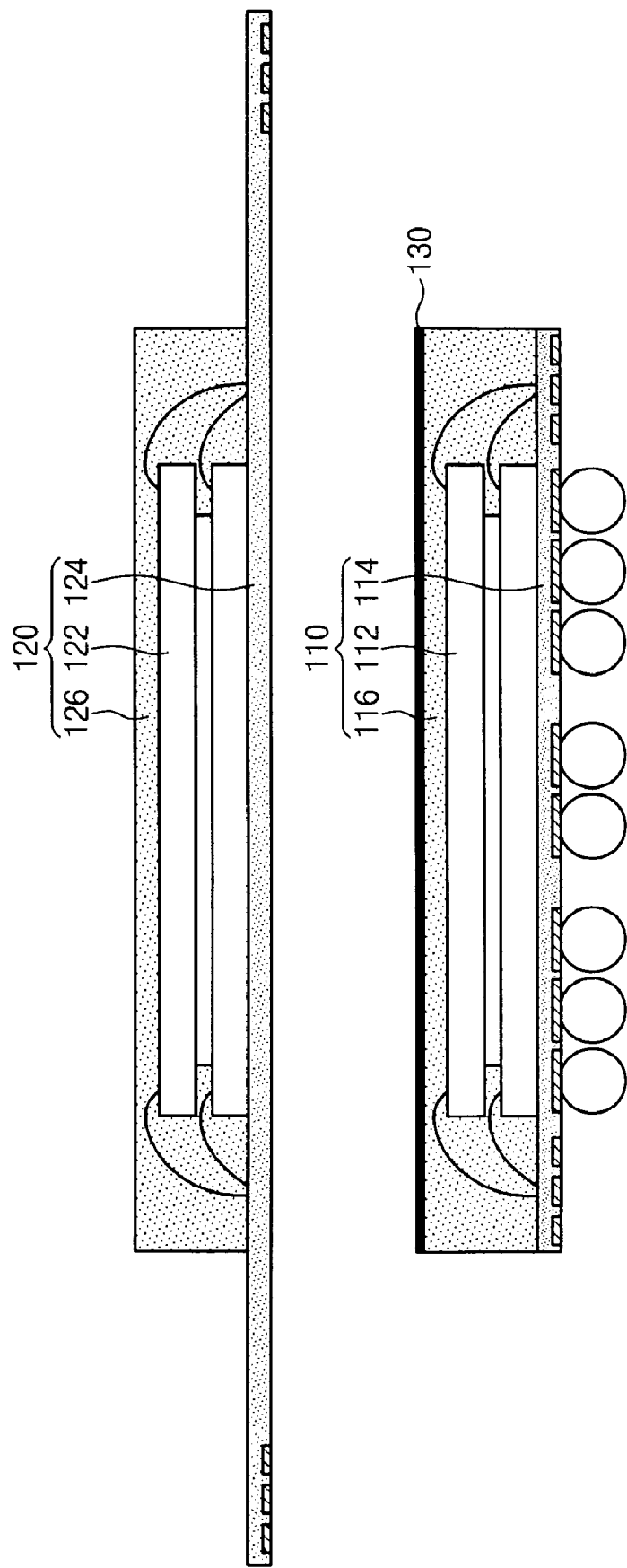

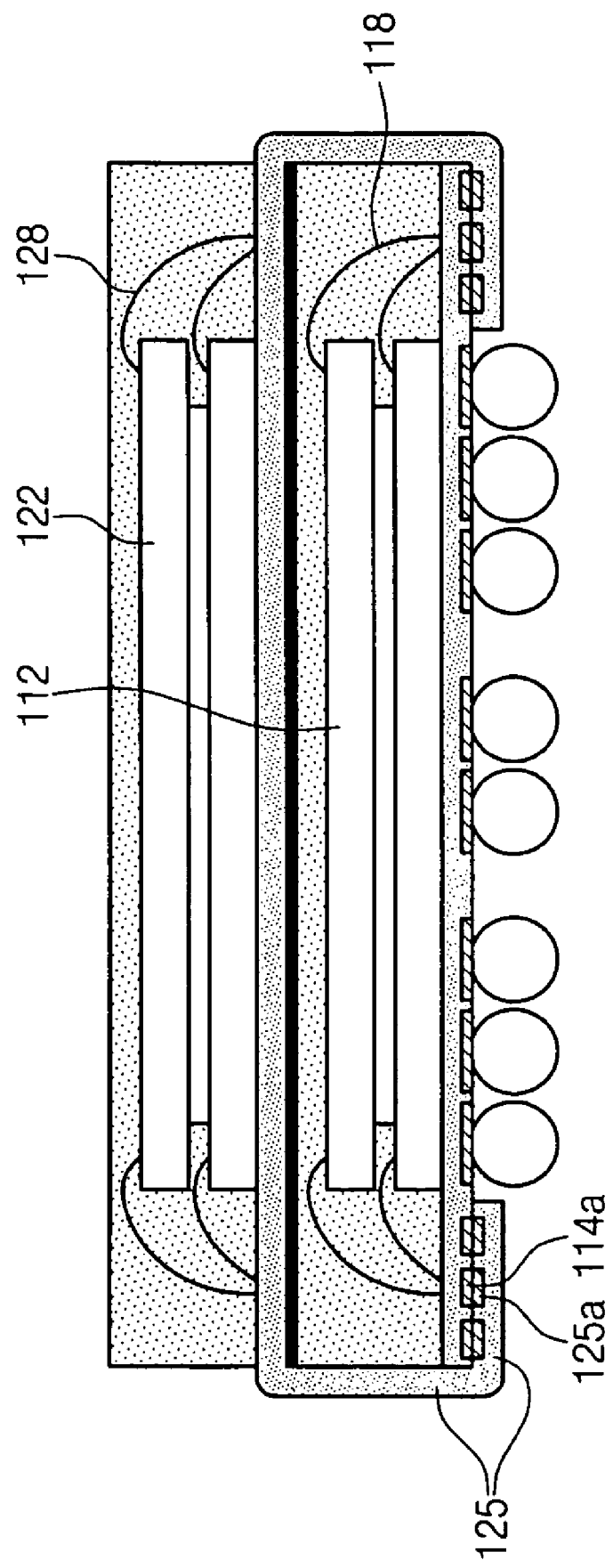

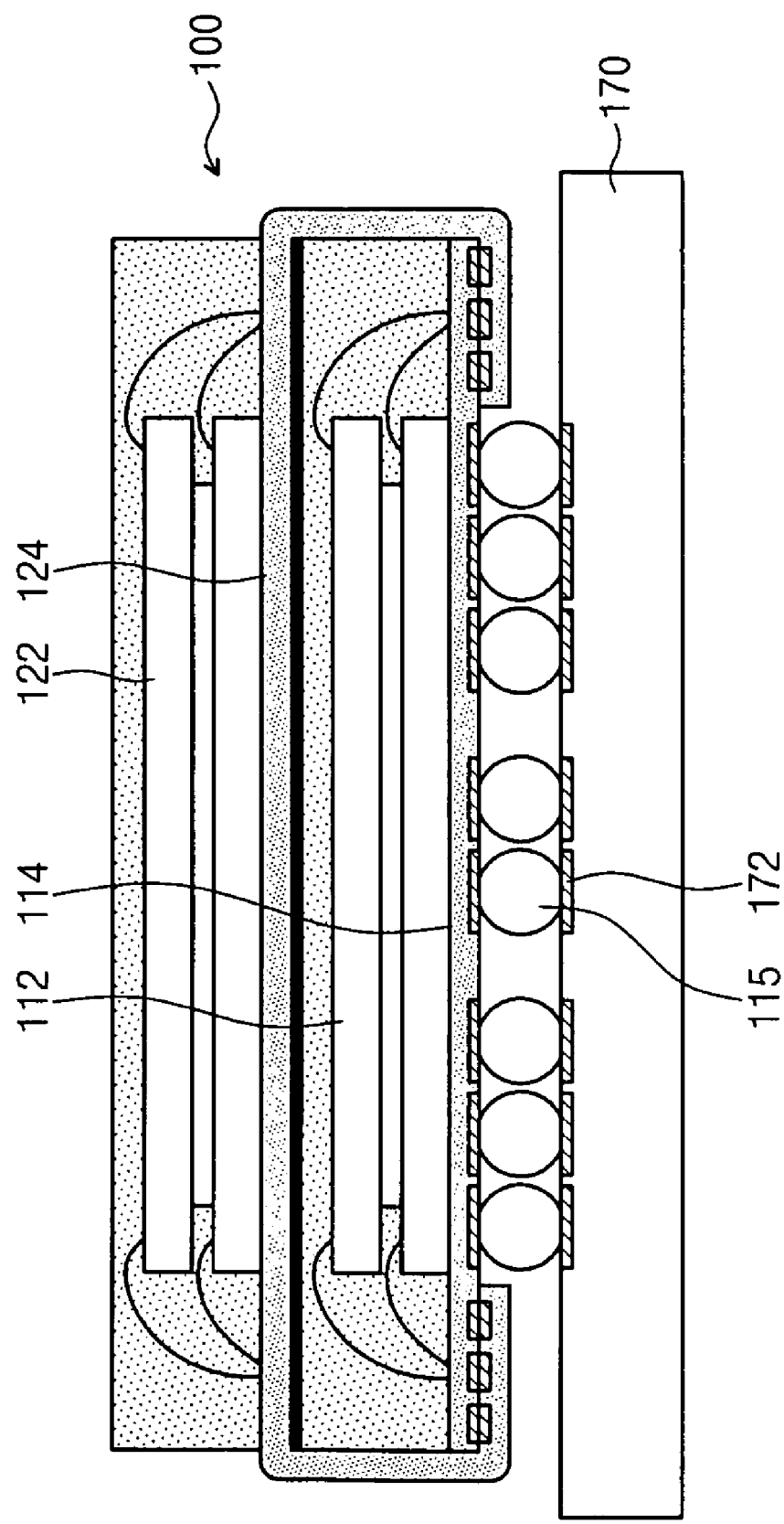

SEMICONDUCTOR PACKAGE AND METHOD FOR MANUFACTURING THE SAME

CROSS-REFERENCE TO RELATED APPLICATIONS

This application claims priority under 35 U.S.C. §119 to Korean Patent Application No. 10-2008-0079573, filed on Aug. 13, 2008, the entire contents of which are herein incorporated by reference.

BACKGROUND

1. Field

Example embodiments relate to a semiconductor device, and more particularly, to a semiconductor package and a method for manufacturing the same.

2. Description of the Related Art

A conventional stack package may have a structure where a plurality of package substrates is stacked. For example, the conventional stack package may include a first package attached to a second package via an adhesive film. Each of the first package and the second package may be an independent package having a circuit substrate and a semiconductor chip mounted on the circuit substrate. A solder ball may be present between the first package and the second package. The solder ball may be used as an interposer to electrically connect the first and second packages. Furthermore, the solder ball may be used as structure to maintain an interval between the first and second packages. Because a stack package may include an interposer, for example, a solder ball between the first and second packages, reducing the size of a conventional stack package may be difficult. Additionally, because wiring patterns connected to the respective solder balls may need to be formed in the first and second packages, the stack package may have a wiring pattern of a relatively complex structure.

SUMMARY

Example embodiments may provide a stacked semiconductor package having a relatively simple structure. Example embodiments may also provide a method for simplifying a manufacturing process of a stacked semiconductor package.

In accordance with example embodiments, a semiconductor package may include a first package including a first semiconductor chip on a first substrate and a second package including a second semiconductor chip on a second substrate, wherein the second substrate covers a side of the first package to electrically connect the first and second packages.

In accordance with example embodiments, a method of manufacturing a semiconductor package may include preparing a first package having a first semiconductor chip on a first substrate, preparing a second package having a second semiconductor chip on a second substrate, and combining the first and second packages, wherein combining the first and second packages includes bending at least one of the first and second substrates to cover at least a side of the first package and connecting the first substrate with the second substrate.

Example embodiments may provide a semiconductor package including a first package where a first semiconductor chip is mounted on a first substrate. The semiconductor package may also include a second package where a second semiconductor chip is mounted on a second substrate. In example embodiments, the second substrate may be bent to cover a side of the first package to contact the first substrate such that the first and second packages may be connected electrically.

In example embodiments, one of the first and second substrates may include a connection pad and the other one may include a connection terminal contacting the contact pad.

In example embodiments, the first package may include a top facing the second package, a bottom opposite to the top, and a side. The first package may include a first external connection terminal attached to the first substrate. The second package may include a second external connection terminal attached to the second substrate. The first external connection terminal may be disposed on the bottom of the first package and the second external connection terminal may be disposed on the side of the first package.

In example embodiments, the second substrate may be bent downward to cover at least a portion of the bottom of the first package.

In example embodiments, the first substrate may be bent upward to cover the side of the first package and the second substrate may be bent downward to cover the side of the first package.

In example embodiments, the first and second substrates may be flexible printed circuit boards.

In example embodiments, semiconductor packages may include a first package including at least one first semiconductor chip mounted on a first substrate and a first molding layer covering the first semiconductor chip. The semiconductor package may further include a second package stacked on the first package, the second package including at least one second semiconductor chip mounted on a second substrate and a second molding layer covering the second semiconductor chip. The semiconductor package may further include an adhesive layer between the first molding layer and the second substrate, wherein the at least one of the first and second substrates includes a connection part bent to cover the first package.

In example embodiments, the first package may include a top facing the second package, a bottom opposite to the top, and a side. A first external connection terminal may be formed on the first substrate and a second external connection terminal may be formed on the second substrate. The first external connection terminal may be disposed on the bottom of the first package and the second external connection terminal may be disposed on the side of the first package.

In example embodiments, the first package may include a top facing the second package, a bottom opposite to the top, and a side, and the first and second substrates may overlap each other on the bottom.

In example embodiments, the connection part may include a first connection part formed in the first substrate and a second connection part formed in the second substrate. The first and second connection parts may overlap each other on the first package and connection pads may be formed in the first and second connection parts to be electrically connected to each other.

In example embodiments, the first package may include a top facing the second package, a bottom opposite to the top, and a side. The first and second connection parts may overlap each other on the side.

In example embodiments, the first connection part may be interposed between the second connection part and the side.

Example embodiments may provide a semiconductor package including a first package including at least one first semiconductor chip on a first substrate; and a second package including at least one second semiconductor chip on a second substrate, wherein at least one of the first and second substrates is bent to cover at least a side of the first package and to electrically connect the first and second packages.

In example embodiments, a method of manufacturing a semiconductor package may include preparing a first package where a first semiconductor chip is mounted on a first substrate, preparing a second package where a second semiconductor chip is mounted on a second substrate, and combining the first and second packages. The combining of the first and second packages may include bending at least one of the first and second substrates in order to cover the first package and connecting the first substrate with the second substrate.

In example embodiments, the combining of the first and second packages may include directly combining the second substrate with the first package through a tape automated bonding (TAB) packaging method.

In example embodiments, the combining of the first and second packages may include interposing an adhesive layer between the first package and the second package.

In example embodiments, the bending of at least one of the first and second substrates may further include heating the first and second substrates.

In example embodiments, the methods may further include forming a first external connection terminal on the first substrate and forming a second external connection terminal on the second substrate.

In example embodiments, the combining of the first and second packages may include overlapping the first and second substrates on the first package.

In example embodiments, overlapping portions of the first and second substrates may be used as a connection region to electrically and directly connect the first and second substrates.

BRIEF DESCRIPTION OF THE FIGURES

Example embodiments will be more clearly understood from the following detailed description taken in conjunction with the accompanying drawings. FIGS. 1A-9 represent non-limiting, example embodiments as described herein. In the figures:

FIG. 1A is a cross-sectional view of a semiconductor package according to example embodiments;

FIGS. 2A through 2D are views illustrating a method of manufacturing the semiconductor package of FIGS. 1A and 1B and the semiconductor device including the same;

FIG. 7 is a view illustrating a package module with a semiconductor package to which a technique of example embodiments may be applied;

FIG. 8 is a block diagram illustrating an electron device with a semiconductor device to which a technique of example embodiments may be applied; and FIG. 9 is a block diagram illustrating a memory system with a non-volatile memory device according to example embodiments.

DETAILED DESCRIPTION OF EXAMPLE EMBODIMENTS

Figure 1A:
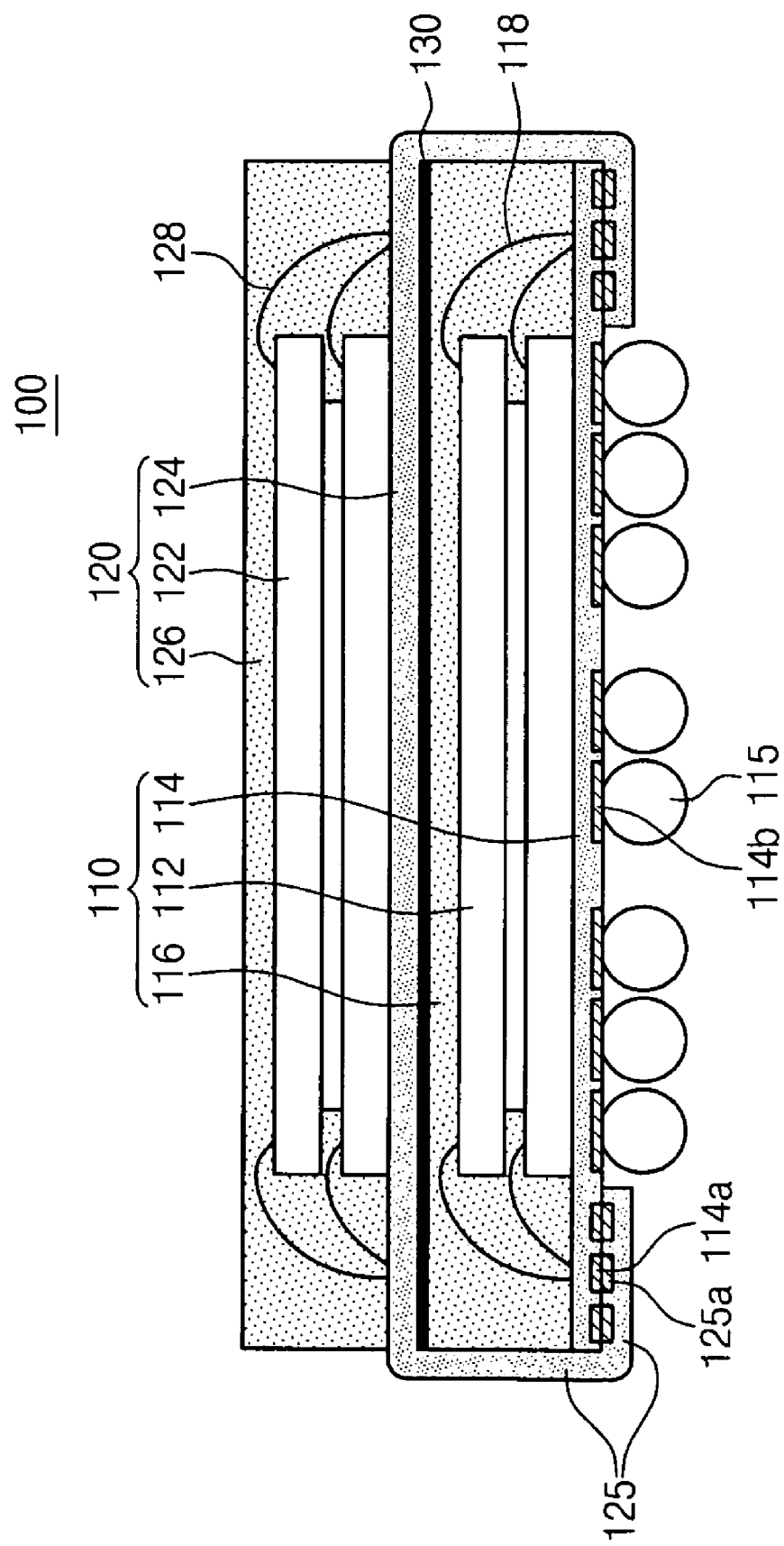

Example embodiments will now be described more fully with reference to the accompanying drawings, in which example embodiments are shown. Example embodiments may, however, be embodied in different forms and should not be construed as limited to example embodiments set forth herein. Rather, example embodiments are provided so that this disclosure will be thorough and complete, and will fully convey the scope of the invention to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments.

Figure 1B:
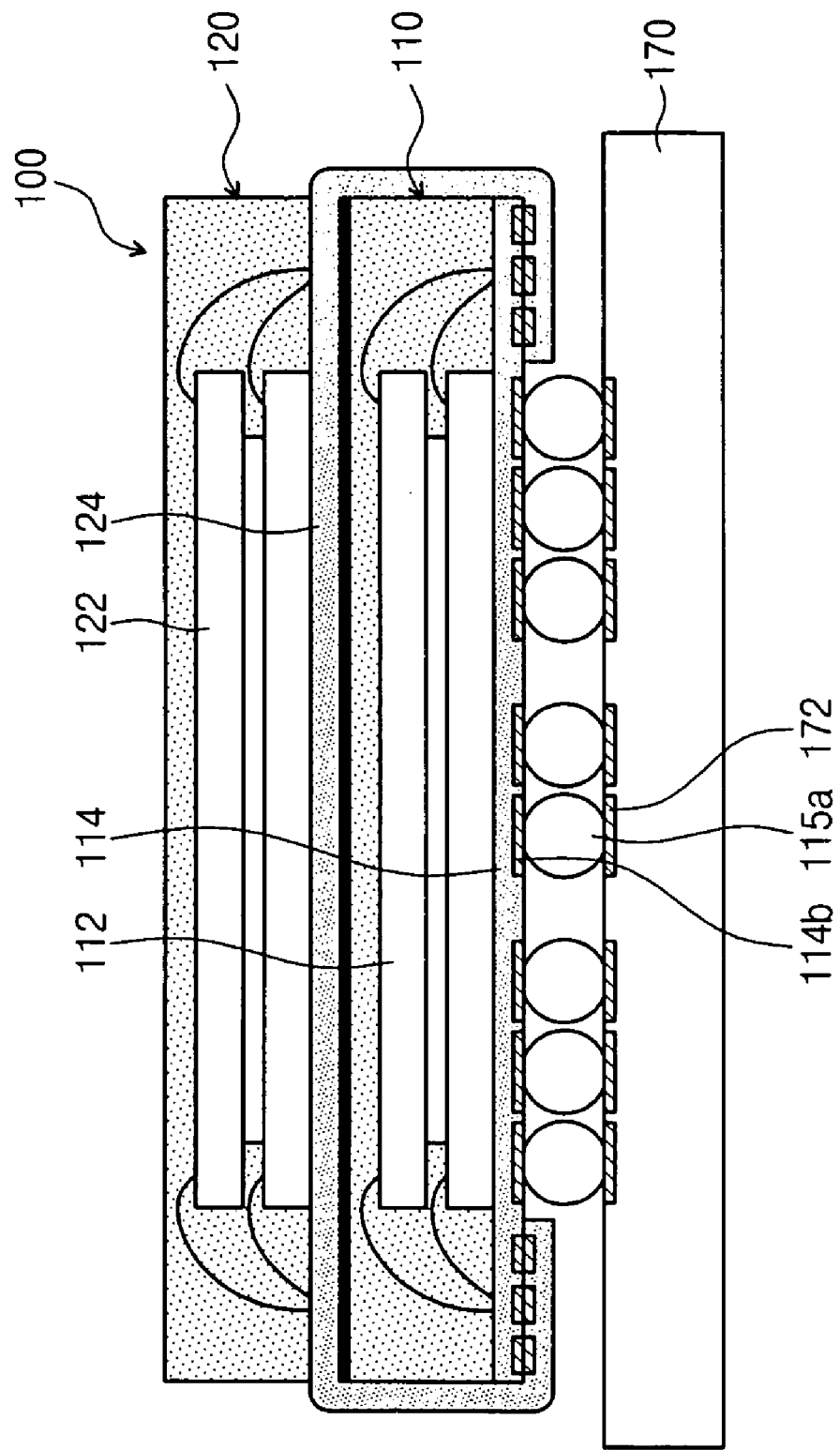
FIG. 1B is a cross section view of a semiconductor device having the semiconductor package of FIG. 1A.

FIG. 1A is a cross-sectional view of a semiconductor package according to example embodiments. FIG. 1B is a cross section view of a semiconductor device having the semiconductor package of FIG. 1A.

Referring to FIG. 1A, a semiconductor package 100 according example embodiments may include a first package 110 and a second package 120 attached to each other. Each of the first package 110 and the second package 120 may be an independent package. The second package 120 may be stacked on the first package 110. An adhesive layer 130 may be interposed between the first package 110 and the second package 120. The adhesive layer 130 may be a material to attach the first package 110 to the second package 120. The adhesive layer 130 may be formed of resin. For example, a polyimide film may be used as the adhesive layer 130.

The first package 110 may include a first substrate 114 and a first semiconductor chip 112 mounted on the first substrate 114. The first substrate 114 may be a circuit substrate for electrically operating the first semiconductor chip 112. For example, the first substrate 114 may include a flexible printed circuit board (PCB). The first package 110 may include at least one first semiconductor chip 112. For example, one first semiconductor chip 112, or a plurality of the first semiconductor chips 112, may be stacked on the first substrate 114. The first semiconductor chip 112 may be electrically connected to the first substrate 114 through a first bonding wire 118. An external connection terminal 115 may be formed on the first substrate 114 in order to electrically connect the semiconductor package 100 with an external unit (not shown). The external connection terminal 115 may be fused on a connection pad 114b formed in the first substrate 114.

The second package 120 may include a second substrate 124 and a second semiconductor chip 122 mounted on the second substrate 124. The second substrate 124 may be a circuit substrate for electrically operating the second semiconductor chip 122. Furthermore, the second substrate 124 may be a circuit substrate having flexibility. For example, the second substrate 124 may include a flexible PCB. The second package 120 may include at least one second semiconductor chip 122. For example, one second semiconductor chip 122, or a plurality of second semiconductor chips 122, may be stacked on the second substrate 124. The second semiconductor chip 122 may be electrically connected to the second substrate 124 through a second bonding wire 128.

The first package 110 may further include a first molding layer 116 covering the first semiconductor chip 112 and the second package 120 may further include a second molding layer 126 covering the second semiconductor chip 122. The first and second molding layers 116 and 126 may be formed of a material including resin. For example, the first and second molding layers 116 and 126 may be formed of epoxy molding compound (EMC). These first and second molding layers 116 and 126 may protect the first and second semiconductor chips 112 and 122 from chemical/physical external environments.

Additionally, the first and second substrates 114 and 124 may be directly combined to electrically connect the first and second semiconductor chips 112 and 122. For example, a first connection pad 114a may be formed in the first substrate 114. Alternatively, the first connection pad 114a may be formed at a top surface (i.e., a chip-mounted surface) or a bottom surface (i.e., a ball-mounted surface) of the first substrate. The first connection pad 114a may be connected to the first bonding wire 118 through a wiring pattern (not shown) formed in the first substrate 114. The first connection pad 114a may be formed at one side edge of the first substrate 114. A second connection pad 125a may be formed in the second substrate 124. The connection part 125 may be a portion of the second substrate 124, which directly contacts the first substrate 114. For example, the connection part 125 may be an edge portion of the second substrate 124 covering the first package 110. The second connection pad 125a may be connected to the second bonding wire 128 through a wiring pattern (not shown) formed in the second substrate 124. The first and second connection pads 114a and 125a may be electrically connected to each other. Additionally, a connection terminal such as a solder ball, a pre-solder ball or a bump may be interposed between the first and second connection pads 114a and 125a to electrically connect the first and second connection pads 114a and 125a. Accordingly, the first and second substrates 114 and 124 may be combined with each other such that the first and second semiconductor chips 112 and 122 are electrically connected to each other.

The second substrate 124 may cover the first package 110. For example, the first package 110 may have a top facing the second package 120, a bottom opposite to the top, and sides. The second substrate 124 may cover the top, the sides, and an edge region of the bottom. Accordingly, the second substrate 124 may cover at least one of the sides of the first package 110. In other words, a conventional semiconductor package may have a box shape, for example, with a top, a bottom, and the four sides. The second substrate 124 may cover two sides facing each other among the four sides. Or, the second substrate 124 may cover all the four sides. This form of the second substrate 124 may be obtained by bending the flat second substrate 124.

A portion of the first substrate 114 and a portion of the second substrate 124 may overlap on the first package 110. The overlapping portions of the first and second substrates 114 and 124 may be used as a connection region where the first substrate 114 and the second substrate 124 may be electrically connected to each other. For example, at the connection region the first substrate 114 and the second substrate 124 may be directly, as well as electrically, connected to each other.

According to the semiconductor package 100, the first substrate 114 in the first package 110 may be directly combined with the second substrate 124 in the second package 120, such that the first and second semiconductor chips 112 and 122 are electrically connected. Accordingly, the semiconductor package 100 may electrically connect the first and second semiconductor chips 112 and 122 in the respective first and second packages 110 and 120 (each of them is an independent package) without an additional interposer, for example, a solder ball between the first and second semiconductor chips 112 and 122.

Referring to FIG. 1B, the semiconductor package of FIG. 1A may be mounted on an external unit 170 to provide one complete semiconductor device. For example, the semiconductor device may include the semiconductor package 100 and the external unit 170, which may be electrically connected to each other. As mentioned above with reference to FIG. 1A, the semiconductor package 100 may have the first and second packages 110 and 120 electrically and directly connected to each other through the first and second substrates 114 and 124. The first package 110 may include the first semiconductor chip 112 mounted on the first substrate 114 and the second package 120 may include the second semiconductor chip 122 mounted on the second substrate 124. The second substrate 124 may cover the first package 110 and may be directly combined with the first substrate 114. The first substrate 114 may include an external connection terminal 115a fused on the connection pad 114b. An external connection pad 172 may be formed on the external unit 170 to be electrically connected to the external connection terminal 115a. The semiconductor package 100 and the external unit 170 may be electrically/physically connected to each other by connecting the external connection pad 172 to the external connection terminal 115a.

Additionally, the external unit 170 may include a device that is electrically operated by the semiconductor package 100. For example, the external unit 170 may include a mobile device, a personal computer, an industrial computer, or a logic device performing various functions. The mobile device may include one of a personal digital assistant (PDA), a web tablet, a mobile phone, a wireless phone, a laptop computer, a memory card, a digital music system, and an information transmitting/receiving device. The external unit 170 may be a device for wireless communication that may be used for communication interface protocols of a three-generation communication system, for example, Code Division Multiple Access (CDMA), Global System for Mobile Communications (GSM), North American Digital Cellular (NADC), Extended-Time Division Multiple Access (E-TDMA), and CDMA2000.

The semiconductor package of FIGS. 1A and 1B and a method of manufacturing a semiconductor device having the same will be described in more detail. Overlapping descriptions related to the above-mentioned semiconductor package and processes for mounting the semiconductor package in an external unit will be brief or omitted.

FIGS. 2A through 2D are views illustrating a method of manufacturing the semiconductor package of FIGS. 1A and 1B and the semiconductor device including the same.

Referring to FIG. 2A, a first package 110 and a second package 120 may be prepared. The first package 110 may be a completed package by mounting a first semiconductor chip 112 on a first substrate 114. In the same manner, the second package 120 may be a completed package by mounting a second semiconductor chip 122 on a second substrate 124. The first semiconductor chip 112 may be covered by a first molding layer 116 and the second semiconductor chip 122 may be covered by a second molding layer 126. The first molding layer 116 and the second molding layer 126 may protect the first semiconductor chip 112 and the second semiconductor chip 122 from the environment. Each of the first and second molding layers 116 and 126 may be formed after disposing the first and second semiconductor chips 112 and 122 in a mold (not shown) and then injecting a molding material inside the mold.

Figure 2B:
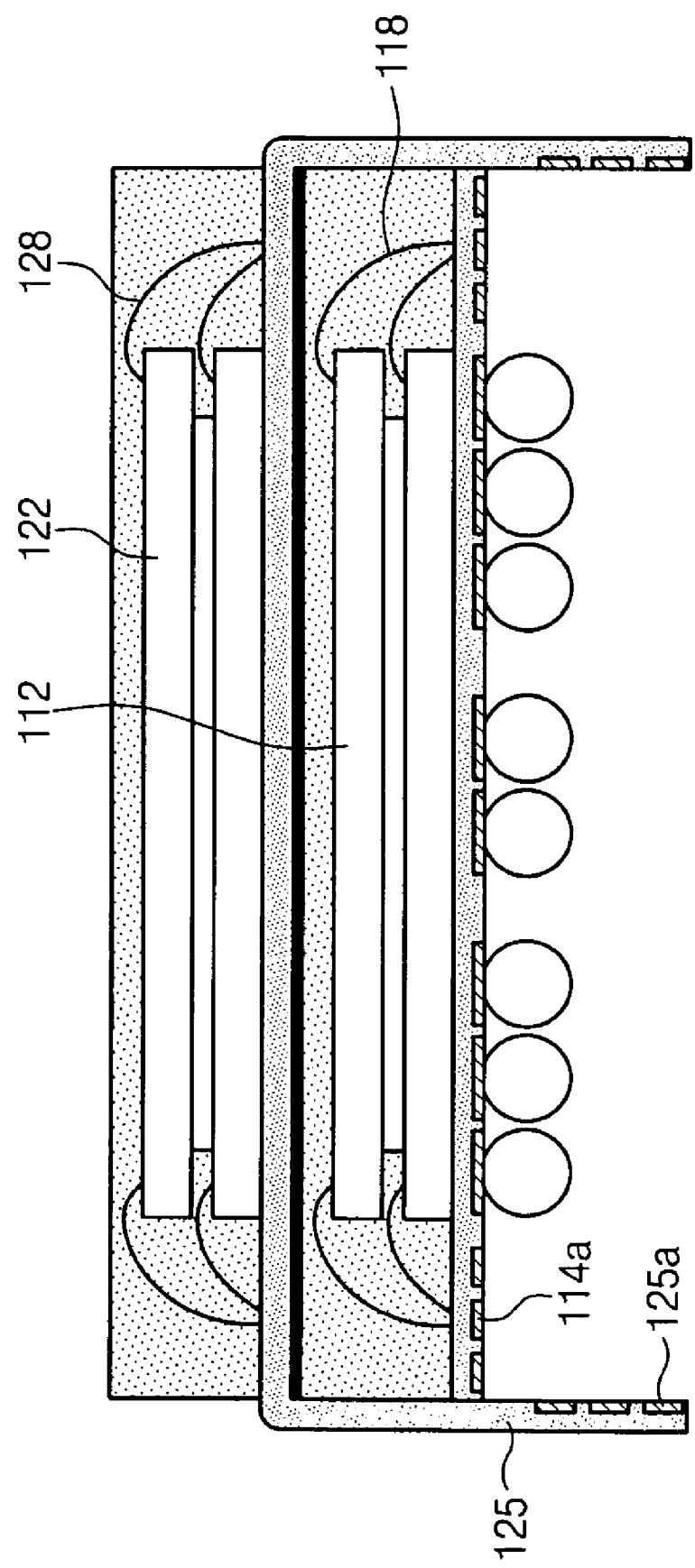

Referring to FIGS. 2B and 2C, the first and second packages 110 and 120 may be combined. The combining of the first and second packages 110 and 120 may be completed through a tape automated bonding (TAB) packaging method. For example, the combining of the first and second packages 110 and 120 may include forming a film type adhesive layer 130 between the first and second packages 110 and 120 and combining the first and second packages 110 and 120 through a wireless bonding method. Accordingly, an additional interposer, for example, a solder ball between the first and second packages 110 and 120, may not be needed.

The first semiconductor chip 112 and the second semiconductor chip 122 may be electrically connected. For example, the second connection pad 125a in the connection part 125 of the second substrate 124 may be connected to the first connection pad 114a in the first substrate 114. For this, the second substrate 124 may be bent downward in order to cover the first package 110. During the bending of the second substrate 124, a process for heating the second substrate 124 may be added. Accordingly, the connection part 125 may be combined with the first substrate 114 while covering the side and bottom of the first package 110. The first connection pad 114a may be electrically connected to the first semiconductor chip 112 through the first bonding wire 118 and the second connection pad 125a may be electrically connected to the second semiconductor chip 122 through the second bonding wire 128. Accordingly, because the first and second substrates 112 and 122 may be combined to each other, the first and second semiconductor chips 112 and 122 may be electrically connected.

Referring to FIG. 2D, the semiconductor package 100 may be attached to the external unit 170. For example, an external connection terminal 115 may be formed on the first substrate 114 of the semiconductor package 100 and the external connection terminal 115 may be disposed on an external connection pad 172 formed in one side of the external unit 170. A reflow process may be performed on the external connection terminal 115 to attach the external connection terminal 115 on the external connection pad 172. Because the external connection terminal 115 may be fused to the external connection pad 172, the external connection terminal 115 may electrically connect the semiconductor package 100 and the external unit 170. Accordingly, the semiconductor device including the semiconductor package 100 and the external unit 170 may be completed.

As mentioned above, according to the semiconductor package 100 of example embodiments, the first substrate 114 in the first package 110 and the second substrate 124 in the second package 120 may be electrically and directly connected to each other such that the first semiconductor chip 112 may be connected to the second semiconductor chip 122. No additional interposer, for example, a solder ball between the first and second semiconductor chips 112 and 122 is required. Therefore, example embodiments provide a semiconductor package having a relatively simple structure such that the size of a semiconductor package may be reduced or minimized.

Additionally, the method of manufacturing a semiconductor package does not include a process for disposing an interposer between the first and second semiconductor chips 112 and 122. Accordingly, example embodiments provide a method of simplifying a manufacturing process of a semiconductor package.

A semiconductor package modified from that in FIG. 1A and a semiconductor device having the same will be described in more detail. Overlapping descriptions related to the above-mentioned semiconductor package and the semiconductor device having the same will be brief or omitted.

Figure 3A:
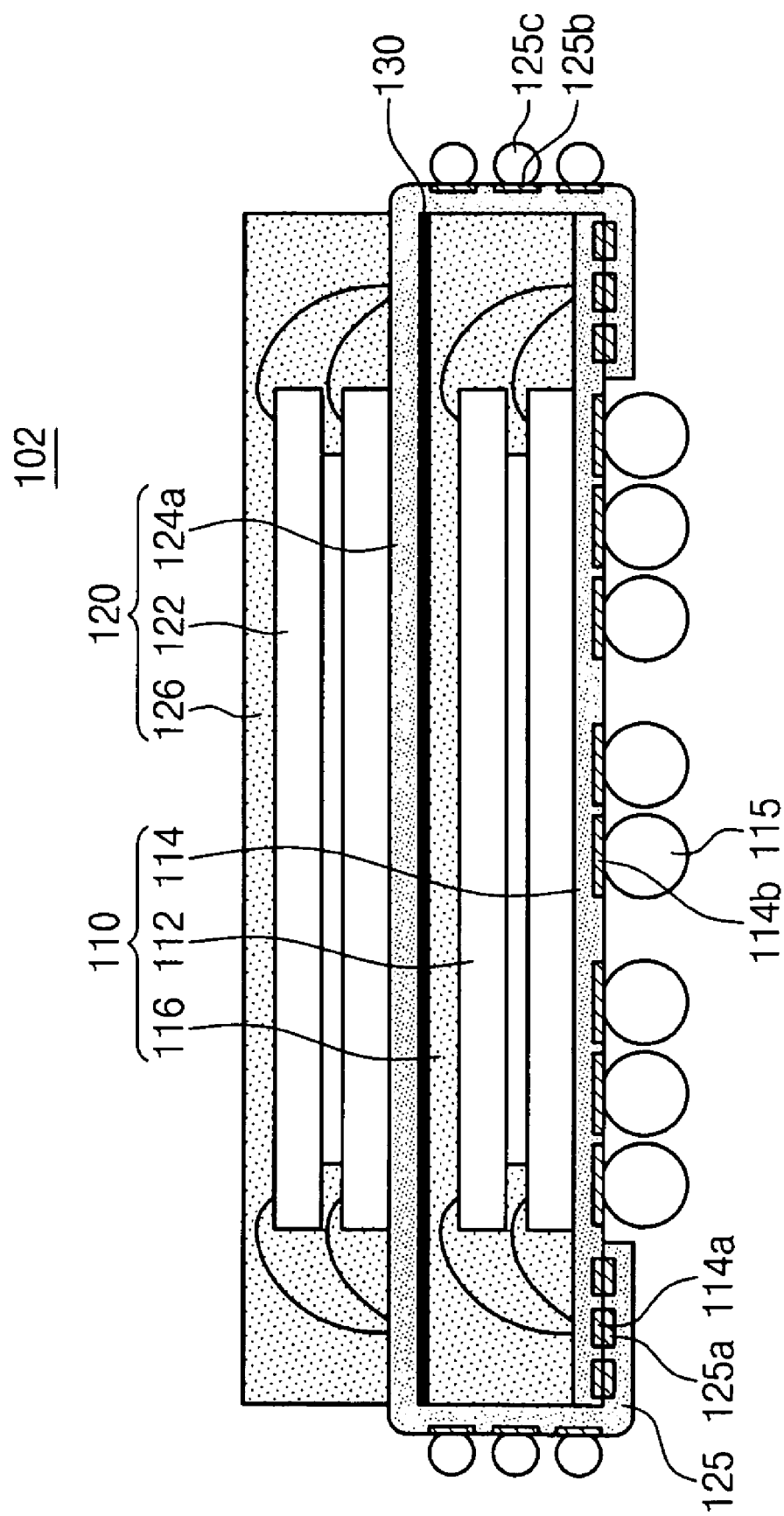
FIG. 3A is a cross-sectional view illustrating a semiconductor package modified from that in FIG. 1A.
Figure 3B:
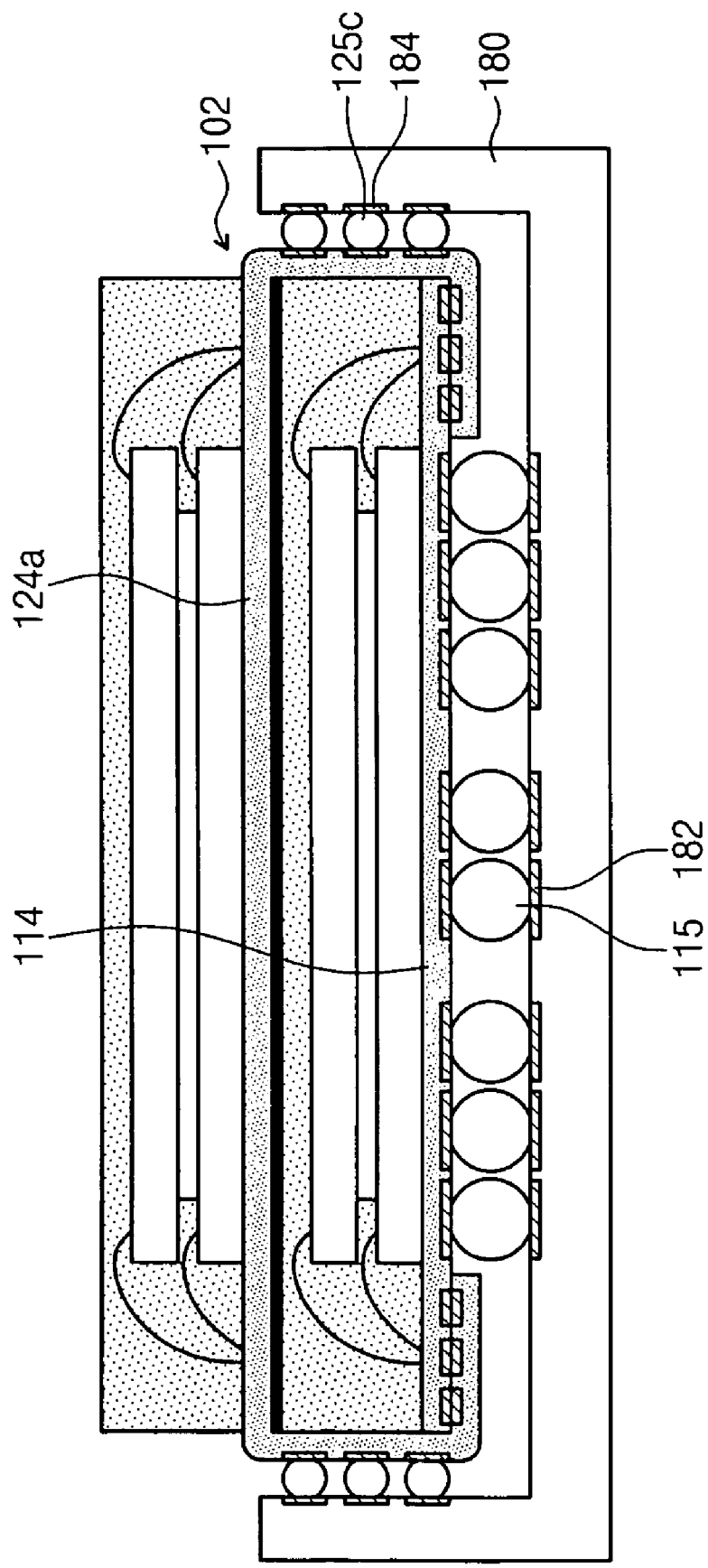
FIG. 3B is a cross-sectional view illustrating a semiconductor device having the semiconductor package of FIG. 3A.

FIG. 3A is a cross-sectional view illustrating a semiconductor package modified from that in FIG. 1A. FIG. 3B is a cross-sectional view illustrating a semiconductor device having the semiconductor package of FIG. 3A.

Referring to FIG. 3A, the modified semiconductor package 102 may include a first package 110 and a second package 120, which may be combined. The first package 110 may include a first substrate 114, a first semiconductor chip 112 mounted on the first substrate 114, and a first molding layer 116 covering the first semiconductor chip 112. In the same manner, the second package 120 may include a second substrate 124a, a second semiconductor chip 122 mounted on the second substrate 124a, and a second molding layer 126 covering the second semiconductor chip 122.

The first package 110 may include a top facing the second package 120, a bottom opposite to the top, and sides. The second substrate 124a may have a connection part 125 covering the sides and the bottom of the first package 110. A second connection pad 125a and a third connection pad 125b may be formed in the connection part 125. The second connection pad 125a may be on the side of the second substrate 124a facing the bottom of the first package 110. The second connection pad 125a may be connected to the first connection pad 114a formed in the first substrate 114. The third connection pad 125b may be disposed in the side opposite to the side of the second substrate 124a facing the side of the first package 110. Accordingly, the first and second substrates 114 and 124a may connect the first and second semiconductor chips 112 and 124 electrically.

A first external connection terminal 115 may be formed on the second connection pad 114b of the first substrate 114, and a second external connection terminal 125c may be formed on the third connection pad 125b of the second substrate 124a. The first and second external connection terminals 115 and 125c may be used as a connection terminal to electrically connect the first and second packages 110 and 120 to an external unit (not shown). The first and second external connection terminals 115 and 125c may include a solder ball.

Referring to FIG. 3B, the semiconductor package 102 of FIG. 3A may be mounted on the external unit 180 to provide one completed semiconductor device. As mentioned above with reference to FIG. 3A, the semiconductor package 102 may have structure where the first and second packages 110 and 120 are electrically connected to each other through the directly combined first and second substrates 114 and 124a. The first external connection terminal 115 may be formed on the first substrate 114 and a second external connection terminal 125c may be formed on the second substrate 124a.

The external unit 180 may include a mobile device, a personal computer, an industrial computer, or a logic device performing various functions. First and second external connection pads 182 and 184 may be formed in the external unit 180. The first external connection pad 182 may contact the first external connection terminal 115 and the second external connection pad 184 may contact the second external connection terminal 125c. The semiconductor package 102 may be detachable from the external unit 180. For example, the first and second external connection terminals 115 and 125c may contact the first and second external connection pads 182 and 184 without a reflow process. Accordingly, the semiconductor package 102 may be freely detachable from the external unit 180.

Hereinafter, a semiconductor package according to example embodiments will be described in more detail. Here, overlapping descriptions related to the above-mentioned semiconductor package will be omitted or brief.

Figure 4A:
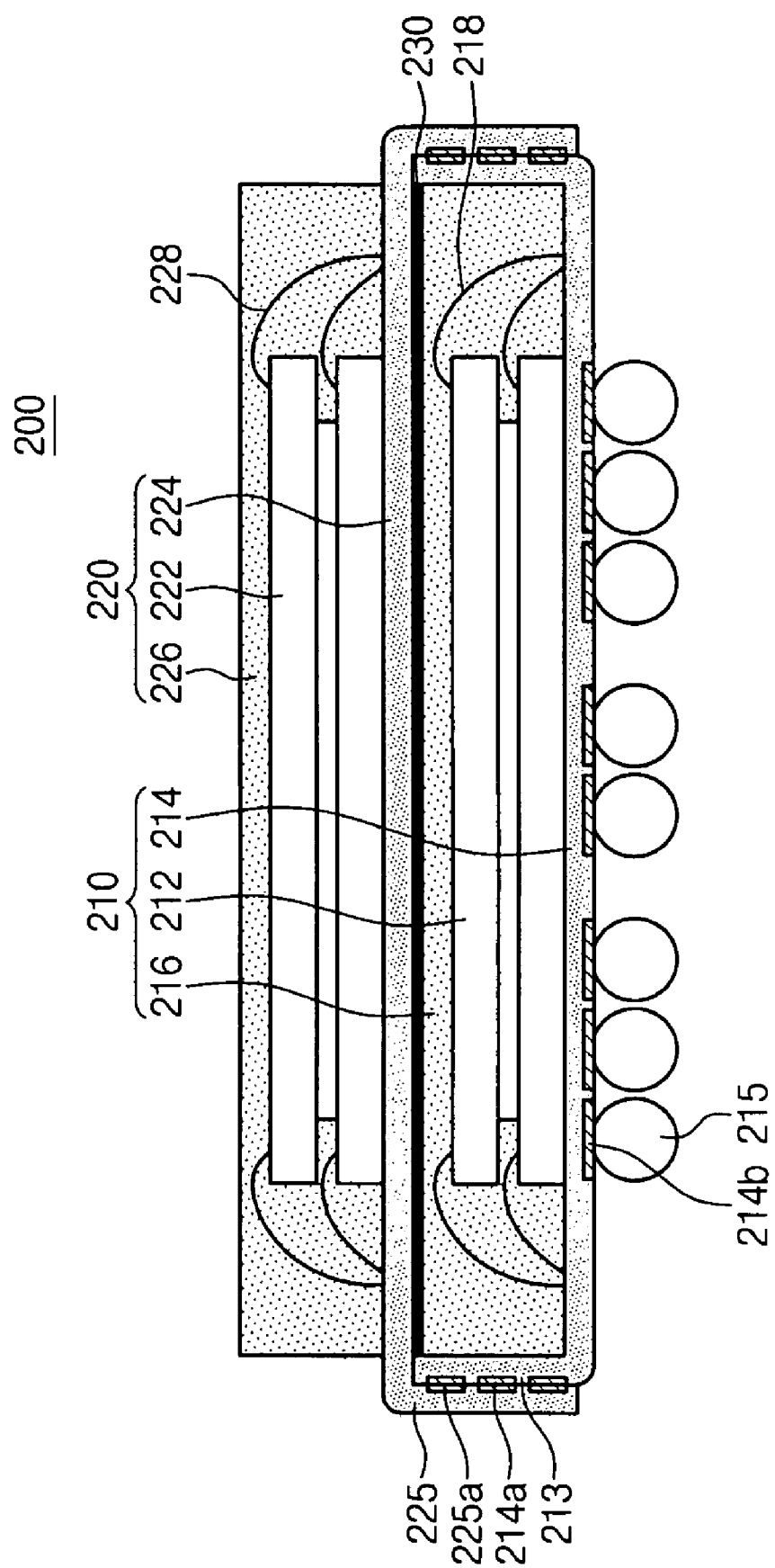
FIG. 4A is a cross sectional view of a semiconductor package according to example embodiments.
Figure 4B:
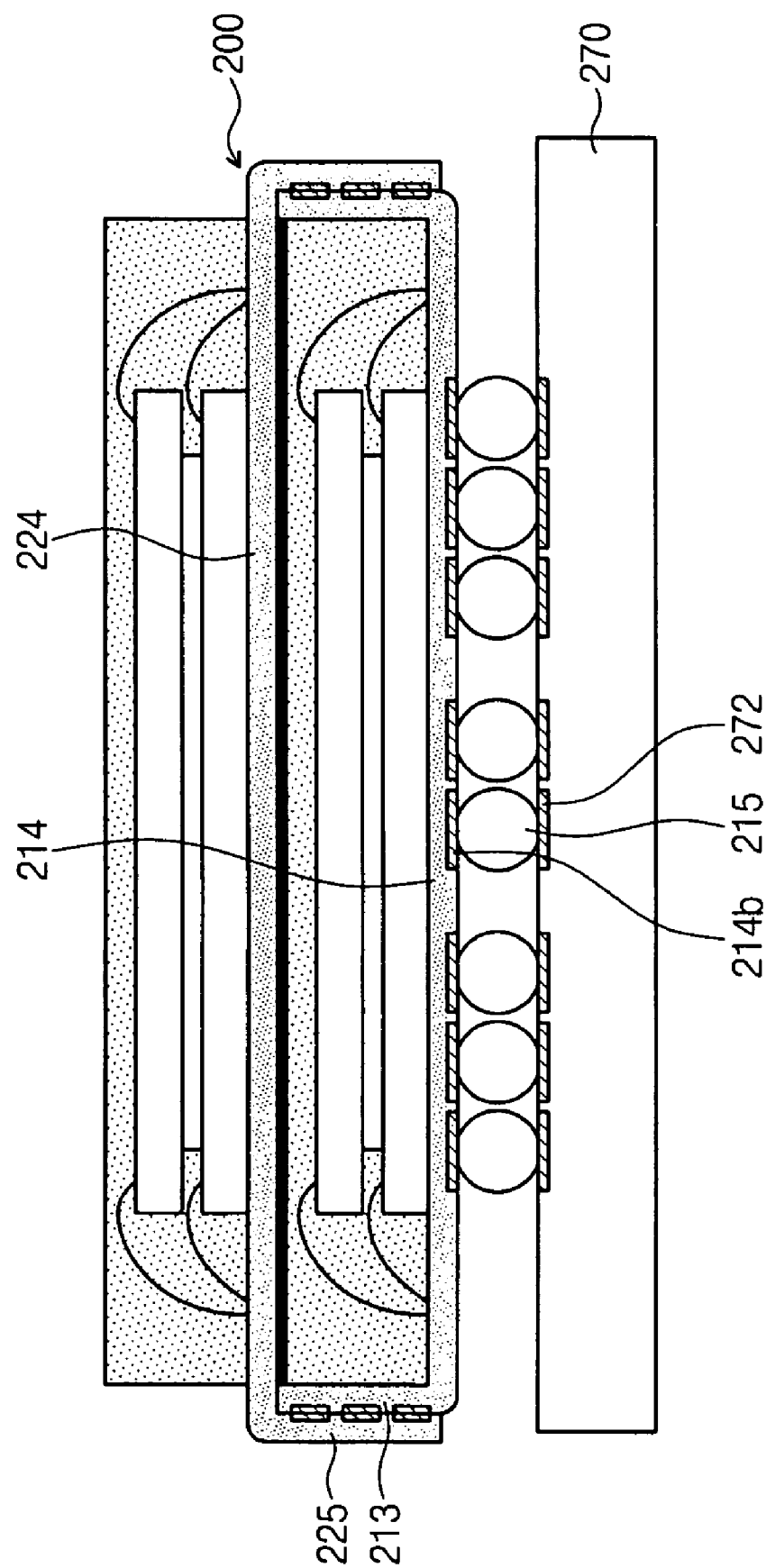
FIG. 4B is a cross-sectional view illustrating a semiconductor device having the semiconductor package of FIG. 4A.

FIG. 4A is a cross sectional view of a semiconductor package 200 according to example embodiments. FIG. 4B is a cross-sectional view illustrating a semiconductor device having the semiconductor package of FIG. 4A.

Referring to FIG. 4A, the semiconductor package 200 according to example embodiments may include a first package 210 attached to a second package 220. Each of the first and second packages 210 and 220 may be an independent package. The second package 220 may be stacked on the first package 210. An adhesive layer 230 may be interposed between the first and second packages 210 and 220.

The first package 210 may include a first substrate 214 and a first semiconductor chip 212 mounted on the first substrate 214. The first substrate 214 may include a flexible PCB. The first package 210 may include at least one first semiconductor chip 212. For example, the first package 210 may include a one semiconductor chip or a plurality of semiconductor chips. The first semiconductor chip 212 may be electrically connected to the first substrate 214 through a first bonding wire 218.

The second package 220 may include a second substrate 224 and a second semiconductor chip 222 mounted on the second substrate 224. The second substrate 224 may include a flexible PCB. The second package 220 may include at least one semiconductor chip 222. For example, the second package 220 may include one semiconductor chip or a plurality of semiconductor chips. The second semiconductor chip 222 may be electrically connected the second substrate 224 through a second bonding wire 228.

The first package 210 may include a first molding layer 216 covering the first semiconductor chip 212 and the second package 220 may include a second molding layer 226 covering the second semiconductor chip 222. The first and second molding layers 216 and 226 may be formed of a material including resin. The first and second molding layers 216 and 226 may protect the first and second semiconductor chips 212 and 222 from chemical/physical environmental environments.

The first and second substrates 214 and 224 may be combined with each other to electrically connect the first and second semiconductor chips 212 and 222. For example, a first connection part 213 may be provided on or at an edge of the first substrate 214. The first connection part 213 may be a portion of the first substrate 214 that will be combined to the second substrate 224. The first connection part 213 may be an edge region of the first substrate 214. A first connection pad 214a may be formed in the first connection part 213. The first connection pad 214a may be connected to the first bonding wire 218 through a wire pattern (not shown) formed in the first substrate 214. A second connection pad 214b may be formed in the first substrate 214 that is exposed to the environment. An external connection terminal 215 may be fused on the second connection pad 214b.

A second connection part 225 may be provided on or near the edge of the second substrate 224. The second connection part 225 may be a portion of the second substrate 224 that may be combined to the first connection part 213. The second connection part 225 may be an edge region of the second substrate 224. The first connection part 213 may be between the second connection part 225 and the side of the first package 210. A third connection pad 225a may be formed in the second connection part 225. The third connection pad 225a may be connected to the second bonding wire 228 through a wiring pattern (not shown) formed in the second substrate 224. The first connection pad 214a and the third connection pad 225a may be electrically connected to each other. Additionally, a connection terminal, for example, a solder ball, may be interposed between the first connection pad 214a and the third connection pad 225a in order to electrically connect the first connection pad 214a and the third connection pad 225a. Accordingly, the first and second substrates 214 and 224 may be directly connected to each other to electrically connect the first and second semiconductor chips 212 and 222.

The first substrate 214 and the second substrate 224 may overlap. For example, the first package 210 may include a top facing the second package 220, a bottom opposite to the top, and sides. The first connection part 213 of the first substrate 214 and the second connection part 225 of the second substrate 224 may overlap on the sides of the first package 210. For example, the first connection part 213 may be formed between the second connection part 225 and the first molding layer 216 to cover the side of the first package 210. The second connection part 225 may be formed to cover the first connection part 213. However, example embodiments are not limited thereto. For example, the second connection part 225 may be formed between the first connection part 213 and the first molding layer 216 to cover the side of the first package 210, and the first connection part 213 may be formed to cover the second connection part 225. The overlapping portion of the first and second connection parts 213 and 225 may be used as a connection region in order to electrically and directly connect the first and second substrates 214 and 224. The first connection pad 214a in the first connection part 213 and the third connection pad 225a of the second connection part 225 may be directly connected at the connection region. In the alternative, a connection terminal, for example, a solder ball may be further interposed between the first connection pad 214a and the third connection pad 225a.

Referring to FIG. 4B, the semiconductor device may include a semiconductor package 200 and an external unit 270, which may be electrically connected. As mentioned above with reference to FIG. 4A, the semiconductor package 200 may include the first and second packages 210 and 220 which may be electrically connected to each other through the first and second substrates 214 and 224. An external connection pad 272 may be formed in the external unit 270 to be electrically connected to the external connection terminal 215. By attaching the external connection terminal 215 to the external connection pad 272, the semiconductor package 200 and the external unit 270 may be electrically/physically connected to each other.

Additionally, the external unit 270 may include a device that may be electrically operated by the semiconductor package 200. For example, the external unit 270 may include a mobile device, a personal computer, an industrial computer, or a logic device performing various functions. The mobile device may include one of a PDA, a web tablet, a mobile phone, a wireless phone, a laptop computer, a memory card, a digital music system, and an information transmitting/receiving device. The external unit 270 may be a device for wireless communication. For example, the external unit 270 may be used for communication interface protocols of a three-generation communication system, for example, CDMA, GSM, NADC, E-TDMA, and CDMA2000.

The semiconductor package of FIGS. 4A and 4B and a method of manufacturing a semiconductor device having the same will be described in more detail. Overlapping descriptions related to the above-mentioned semiconductor package and semiconductor device including the same will be brief or omitted.

FIGS. 5A through 5D are views illustrating a method of manufacturing the semiconductor package of FIGS. 4A and 4B and the semiconductor device including the same.

Figure 5A:
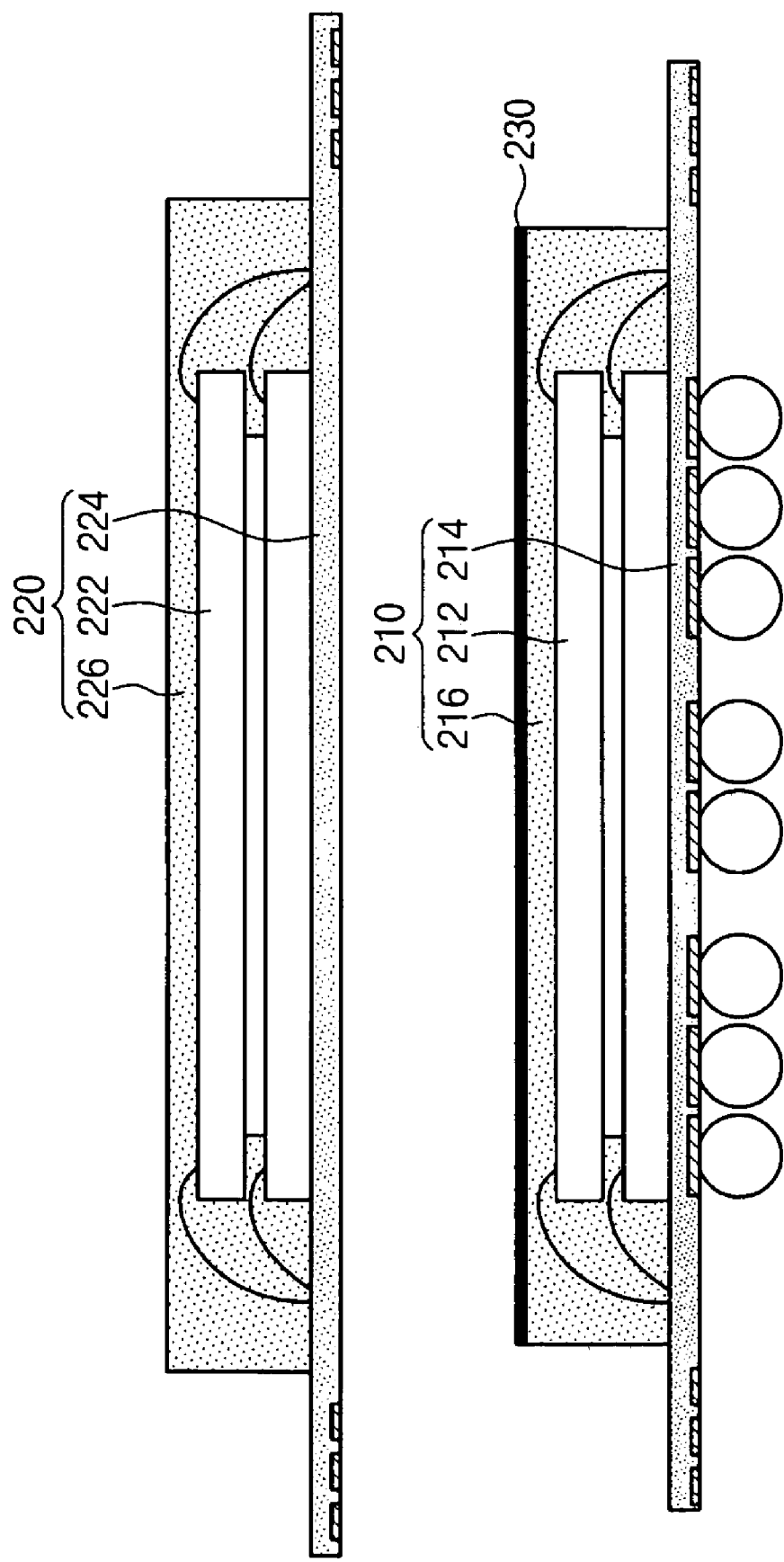
FIGS. 5A through 5D are views illustrating a method of manufacturing the semiconductor package of FIGS. 4A and 4B and the semiconductor device including the same.

Referring to FIG. 5A, a first package 210 and a second package 220 may be prepared. The first package 210 may be a completed package that may include a first semiconductor chip 212 mounted on a first substrate 214. In the same manner, the second package 220 may be a completed package including a second semiconductor chip 222 mounted on a second substrate 224. The first semiconductor chip 212 and the second semiconductor chip 222 may be respectively covered by a first molding layer 216 and a second molding layer 226. The first and second molding layers 216 and 226 may protect the first and second semiconductor chips 212 and 222 from the external environment.

Figure 5B:
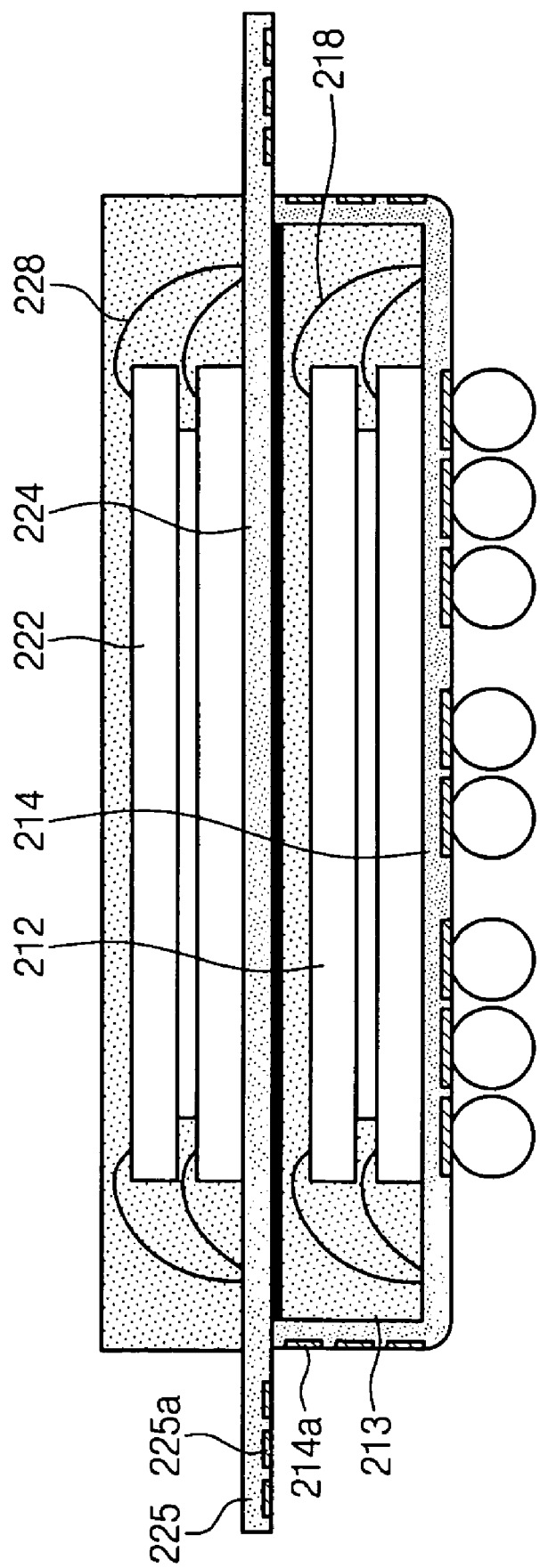
Figure 5C:
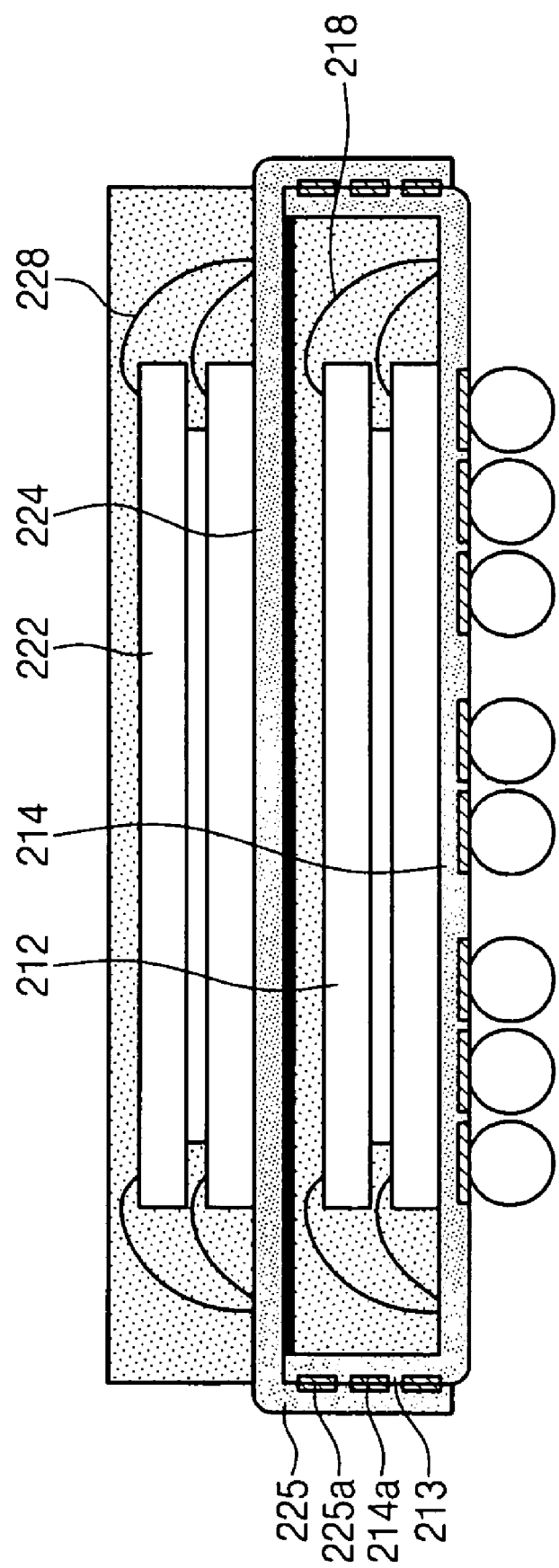

Referring to FIGS. 5B and 5C, the first and second packages 210 and 220 may be attached. Attaching the first and second packages 210 and 220 may be completed through a TAB packaging method. For example, attaching the first and second packages 210 and 220 may include forming a film type adhesive layer 230 between the first and second packages 210 and 220 and combining the first and second packages 210 and 220 through a wireless bonding method.

A first connection part 213 of the first substrate 214 may be connected to a side of the first package 210. For example, the first substrate 214 may be bent upward to allow the first connection part 213 to be connected to a side of the first molding layer 214. During the bending of the first substrate 214, a process for heating the first substrate 214 may be added. Additionally, in order to attach the first substrate 214 to the sides of the first package 210, an adhesive layer (not shown) may be formed on the sides of the first package 210. In order for the second connection part 225 of the second substrate 224 to cover the first connection part 213 covering the sides of the first package 210, the second substrate 224 may be bent downward. During the bending of the second substrate 214, a process for heating the second substrate 224 may be added. Additionally, in order to attach the first connection part 213 to the second connection part 225, an adhesive layer (not shown) may be formed on the first connection part 213 contacting the second connection part 225.

Through the above-mentioned processes, the first connection part 213 and the second connection part 225 may overlap each other on the sides of the first package 210. The first connection pad 214a of the first connection part 213 and the third connection pad 225a of the second connection part 225 may directly contact each other. Accordingly, the first and second semiconductor chips 212 and 222 may be electrically connected to the first and second substrates 214 and 224.

Figure 5D:
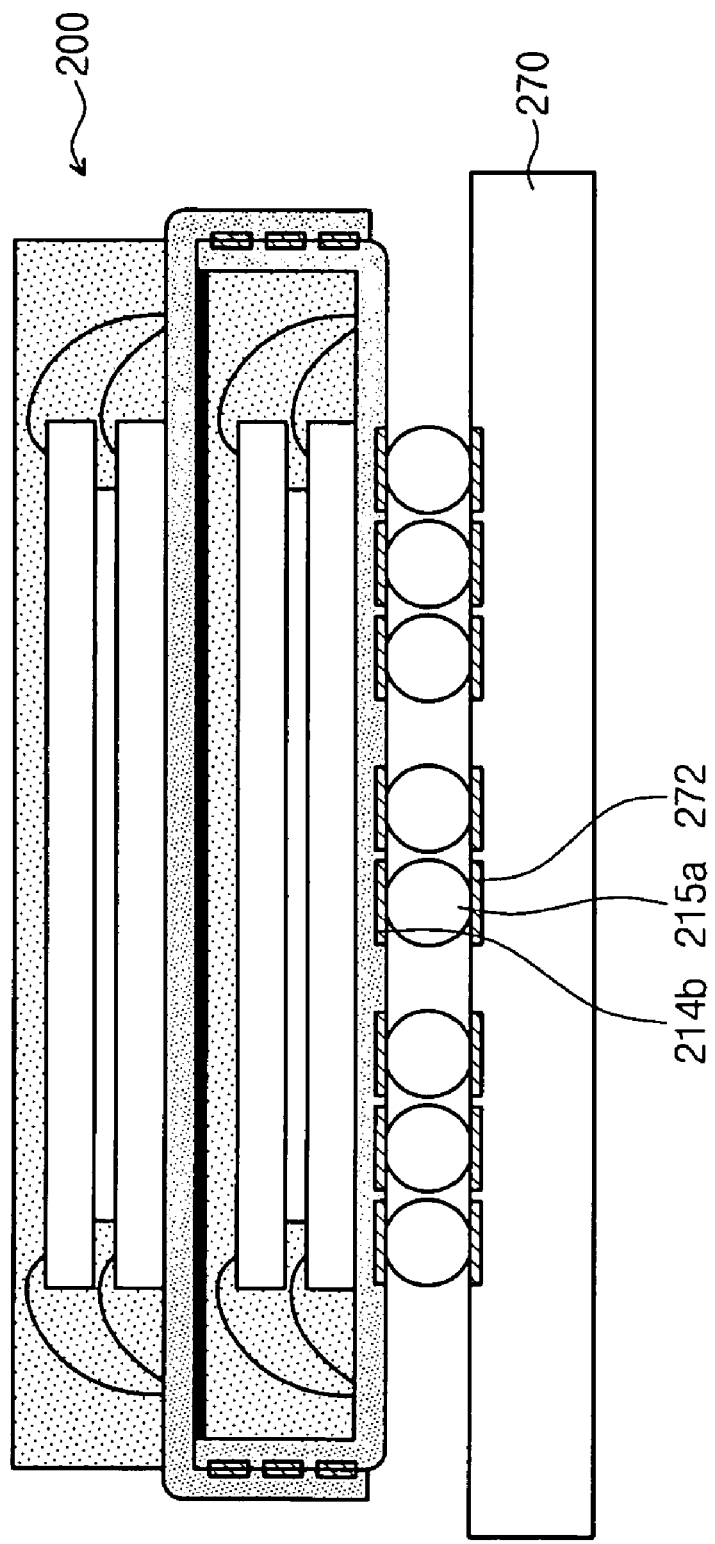

Referring to FIG. 5D, the semiconductor package 200 may be connected to the external unit 270. For example, an external connection terminal 215a formed on the first substrate 214 of the semiconductor package 200 may be positioned on the external connection pad 272 formed in one side of the external unit 270. A reflow process may be performed on the external connection terminal 215a to attach it to the external connection pad 272. Because the external connection terminal 215a may be fused on the external connection pad 272, an electrical connection between the semiconductor package 200 with the external unit 270 may be formed. Therefore, the semiconductor device including the semiconductor package 200 and the external unit 270 may be completed.

A modified semiconductor package and a semiconductor device including the same will be described in more detail. Overlapping description related to the above-mentioned semiconductor package will be brief or omitted.

Figure 6A:
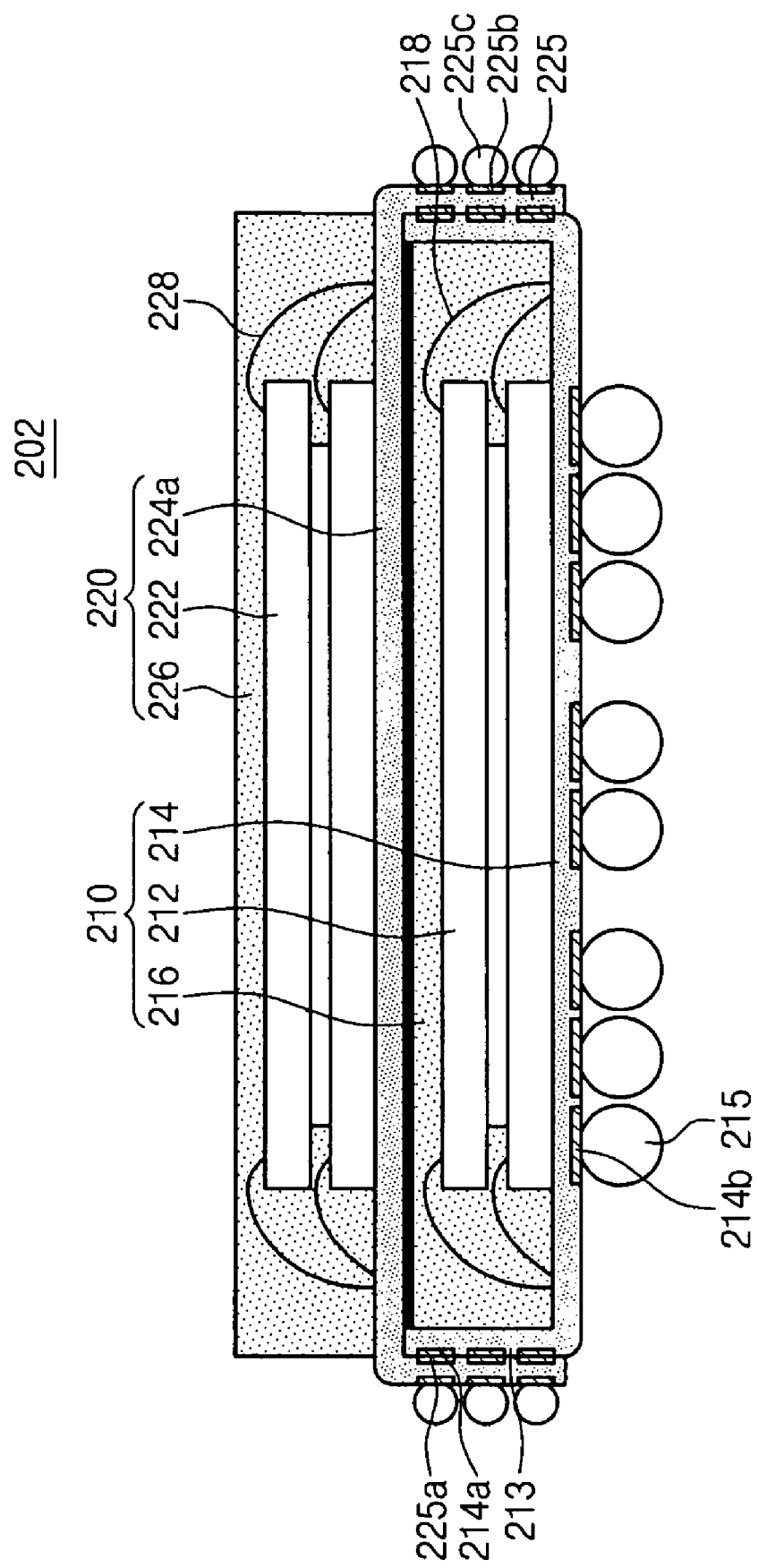
FIG. 6A is a cross-sectional view illustrating a semiconductor package modified from that in FIG. 5A.
Figure 6B:
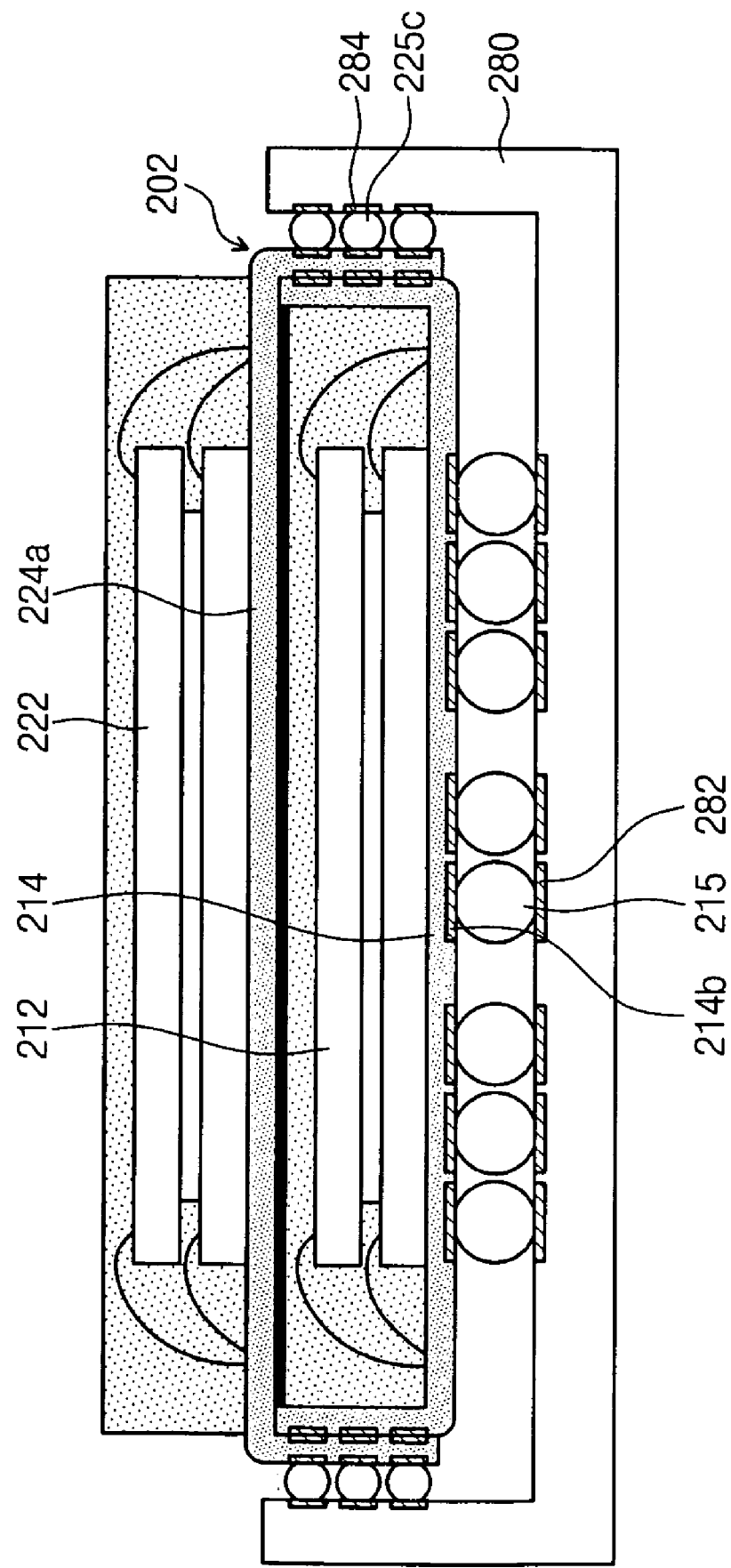
FIG. 6B is a cross-sectional view illustrating a semiconductor device with the semiconductor package of FIG. 6A.

FIG. 6A is a cross-sectional view illustrating a semiconductor package modified from that in FIG. 5A. FIG. 6B is a cross-sectional view illustrating a semiconductor device with the semiconductor package of FIG. 6A.

Referring to FIG. 6A, the modified semiconductor package 202 may include a first package 210 and a second package 220 which may be attached to each other. The first package 210 may be a completed package including a first semiconductor chip 212 mounted on a first substrate 214. In the same manner, the second package 220 may be a completed package including a second semiconductor chip 222 mounted on a second substrate 224a. The first package 210 may include a first molding layer 216 to cover the first semiconductor chip 212, and the second package 220 may include a second molding layer 226 to cover the second semiconductor chip 222.

The first connection part 213 of the first substrate 214 and the second connection part 225 of the second substrate 224a may overlap on a side of the first package 210. The overlapping portions of the first and second connection parts 213 and 225 may be used as a connection region to allow the first and second substrates 214 and 224a to be electrically connected. The first connection pad 214a of the first connection part 213 and the third connection pad 225a of the second connection part 225 may directly connect to each other on the connection region.

A first external connection terminal 215 may be formed on the first substrate 214 and a second external connection terminal 225c may be formed on the second substrate 224a. The second external connection terminal 225c may be formed on the second connection part 225 that may be externally exposed. The second external connection terminal 225c may be fused on the fourth connection pad 225b of the second connection part 225. The first and second external connection terminals 215 and 225c may be used as connection terminals to allow the first and second packages 210 and 220 to be electrically connected to an external unit (not shown). A solder ball may be used as the first and second external connection terminals 215 and 225c.

Referring to FIG. 6B, a semiconductor device may include a semiconductor package 202 and an external unit 280, which may be electrically connected to each other. As mentioned above with reference to FIG. 6A, the semiconductor package 202 may have a structure where the first and second semiconductor chips 212 and 222 are electrically connected through the first and second substrates 214 and 224a.

First and second external connection pads 282 and 284 may be formed in the external unit 280. The first external connection pad 282 may be connected to the first external connection terminal 215, and the second external connection pad 284 may be connected to the second external connection terminal 225c. The semiconductor package 202 and the external unit 280 may be detachable from each other. For example, the first and second external connection terminals 215 and 225c may not be fused to the first and second external connection pads 282 and 284 due to a reflow process.

The external unit 280 may include a device that is electrically operated by the semiconductor package 200. For example, the external unit 280 may include a mobile device, a personal computer, an industrial computer, or a logic device performing various functions. The mobile device may include one of a PDA, a web tablet, a mobile phone, a wireless phone, a laptop computer, a memory card, a digital music system, and an information transmitting/receiving device. The external unit 280 may be a device for wireless communication that may be used for communication interface protocols of a three-generation communication system, for example, CDMA, GSM, NADC, E-TDMA, and CDMA2000.

Figure 7:
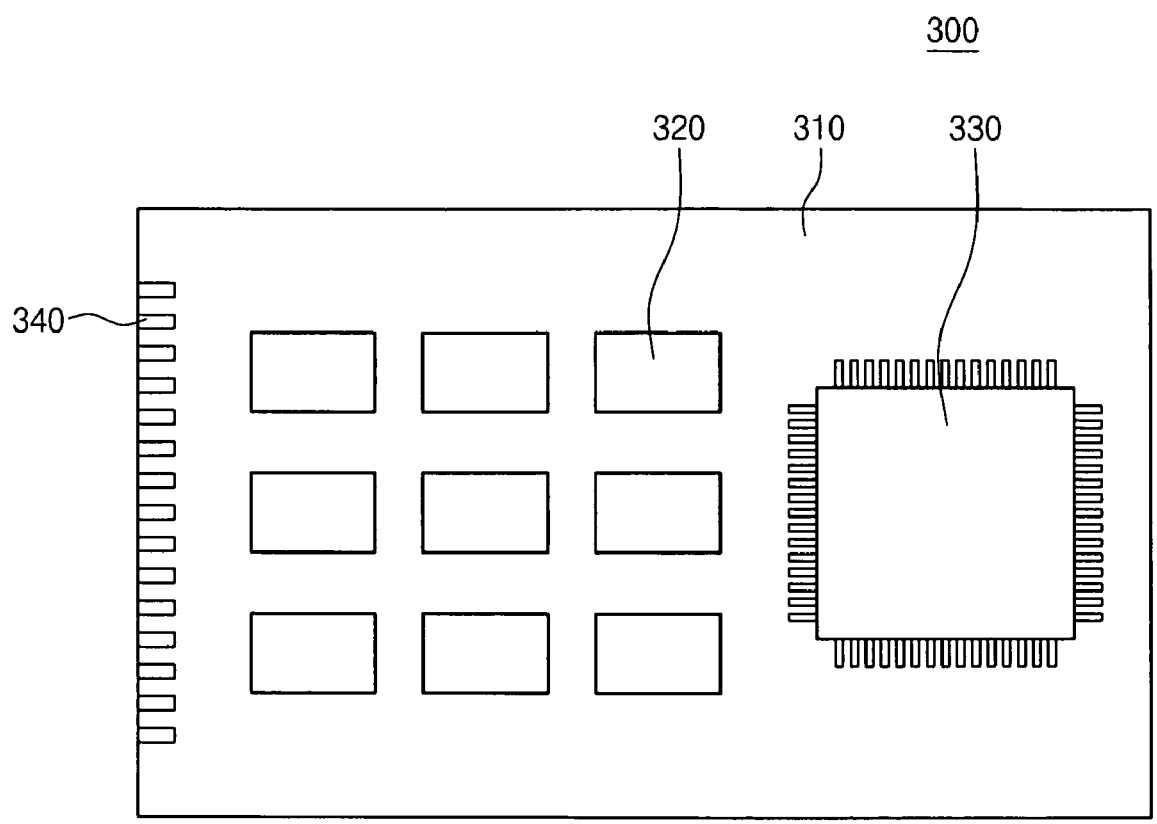

The above-mentioned packaging techniques may be applied to various kinds of semiconductor devices and package modules having the same. FIG. 7 is a view illustrating a package module with a semiconductor package to which a packaging technique illustrated by example embodiments is applied. Referring to FIG. 7, the above-mentioned semiconductor packages may be installed on a substrate 310 to form a package module 300. For example, the semiconductor package to which a semiconductor packaging technique may be applied may be provided with chip-sized semiconductor package devices 320 having the same form and a quad flat package (QFP) semiconductor package device 330. By installing the semiconductor package devices 320 and 330 on the substrate 310, the package module 300 can be completed. The package module 300 may be connected to the external electrical device through an external connection terminal 340 at one side of the substrate 310.

Figure 8:
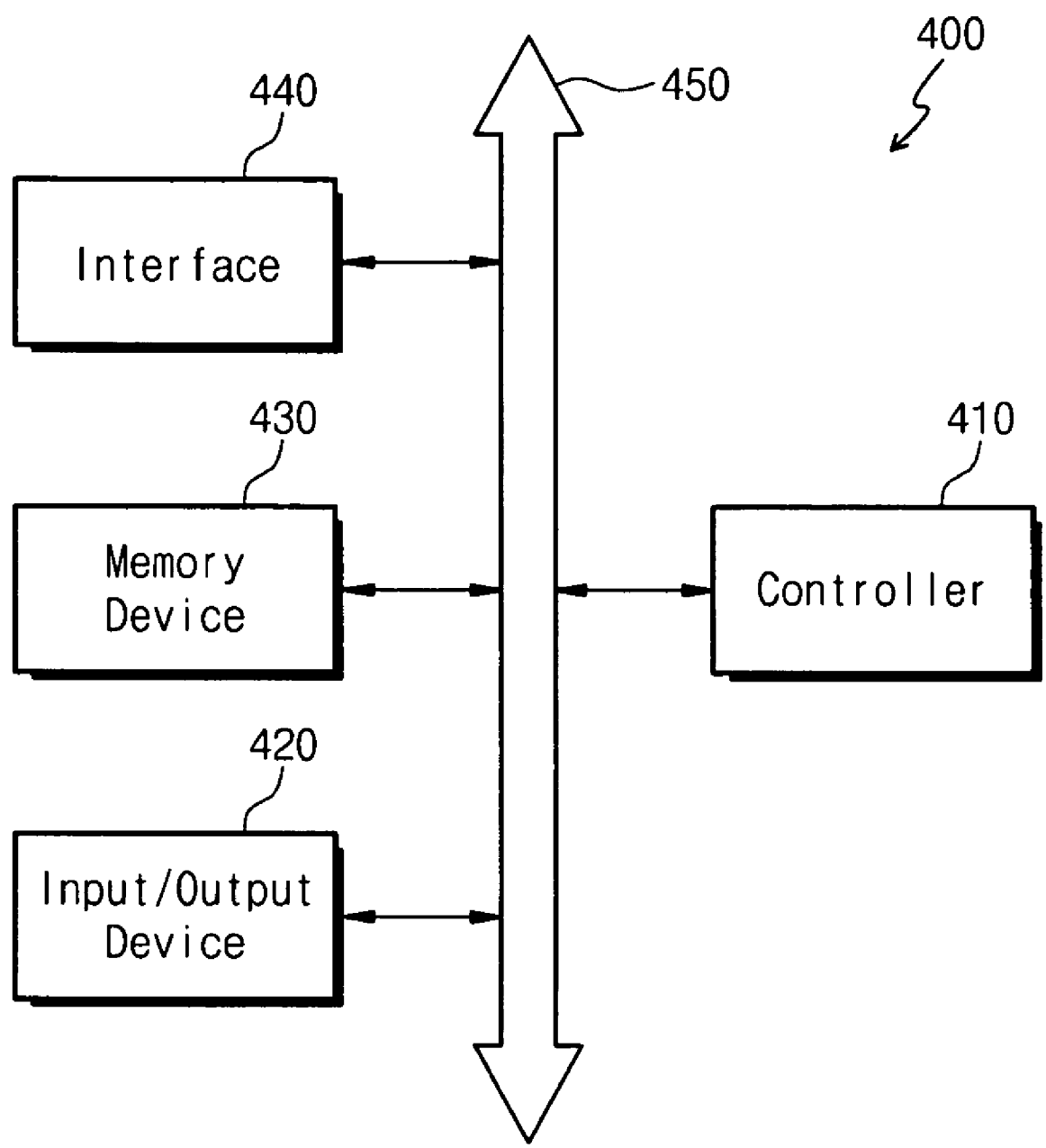

The above semiconductor packaging techniques may be applied to an electrical system. FIG. 8 is a block diagram illustrating an electrical device with a semiconductor device to which packaging techniques of example embodiments may be applied. Referring to FIG. 8, an electrical system 400 may include a controller 410, an input/output device 420, and a memory device 430. The controller 410, the input/output device 420, and the memory device 430 may be connected through a bus 450. The bus 450 may be a path through which data may transfer. For example, the controller 410 may include at least one of microprocessors, digital signal processors, microcontroller, and logic devices capable of performing similar functions thereof. The controller 410 and the memory device 430 may include a semiconductor package according to example embodiments. The input/output device 420 may include at least one of a key pad, a keyboard, and a display device. The memory device 430 may store data. For example, the memory device 430 may store data and/or commands executed by the controller 410. The memory device 430 may include a volatile memory device and/or a non-volatile memory device. The memory device 430 may include a flash memory. For example, a flash memory to which a packaging technique of example embodiments is applied may be mounted on information processing systems, for example, a mobile device or a desktop computer. This flash memory may be used as a solid state disk (SSD). The electrical system 400 may stably store a high capacity data in the flash memory system. The electrical system 400 may further include an interface 440 for transmitting or receiving data via a communication network. The interface 440 may be in a wire/wireless form. For example, the interface 440 may include an antenna or a wire/wireless transceiver. Although not illustrated, it is apparent to those skilled in the art that an application chipset, a camera image processor (CIS), and an input/output device may be further provided in the electron system 400.

Figure 9:
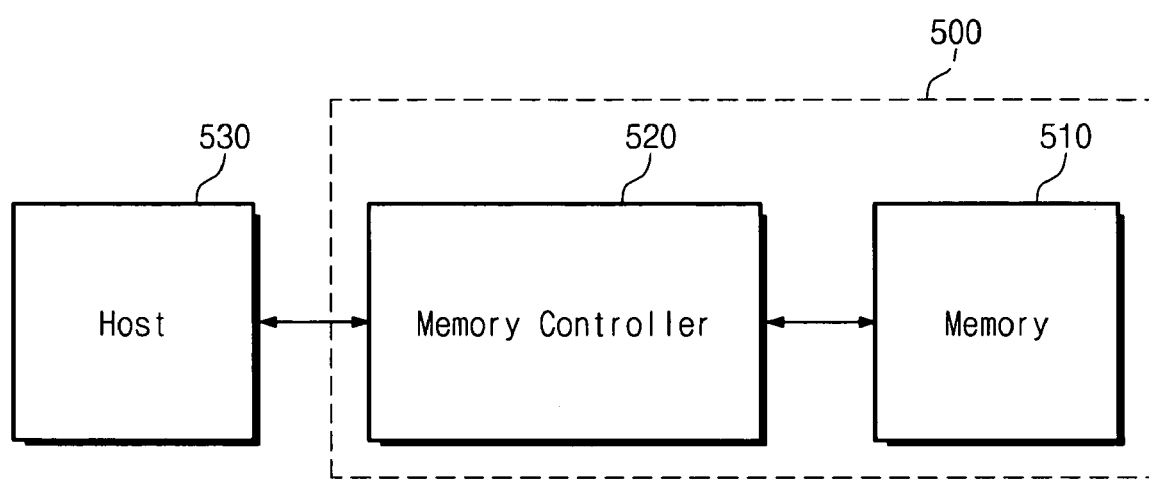

The semiconductor device of example embodiments may be provided in a memory card form. FIG. 9 is a block diagram illustrating a memory system with a non-volatile memory device according to example embodiments. Referring to FIG. 9, a memory card 500 may include a non-volatile memory device 510 and a memory controller 520. The non-volatile memory device 510 and the memory controller 520 may store data or read the stored data. The non-volatile memory device 510 may include at least one of non-volatile memory device to which a semiconductor packaging technique of example embodiments is applied. The memory controller 520 may control the flash memory device 510 to read stored data or store data in response to a read/write request of the host.

Example embodiments provide a stacked semiconductor package without an additional interposer between stacked packages. Example embodiments may provide a stack semiconductor package having a relatively simple structure. Accordingly, example embodiments may provide an ultra thin and miniaturized stacked semiconductor package. Example embodiments may simplify a manufacturing process of a stacked semiconductor package.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor package comprising:
   a first package including at least one first semiconductor chip on a first substrate;
   a second package including at least one second semiconductor chip on a second substrate, wherein at least one of the first substrate and the second substrate is bent toward the first package to cover a side of the first package to electrically connect the first and second packages;
   a first external connection terminal on the first substrate; and
   a second external connection terminal on the second substrate, wherein the second external connection terminal is on the side of the first package, wherein the first and second external connection terminals are disposed to contact an external unit.

2. The semiconductor package of claim 1, wherein a portion of a bottom of the first package includes at least one first connection pad and the second substrate covering the portion of the bottom of the first package includes at least one second connection pad.

3. The semiconductor package of claim 2, wherein the at least one first connection pad and the at least one second connection pad are directly connected.

4. The semiconductor package of claim 1, further comprising:
an adhesive layer between the first package and the second package, wherein the first package further includes a first molding layer covering the first semiconductor chip, the second package further includes a second molding layer covering the second semiconductor chip, the adhesive layer is between the first molding layer and the second substrate, and one of the first and second substrates includes a connection part bent to cover the side of the first package.

5. The semiconductor package of claim 1, wherein
the first substrate includes a first connection part with at least one first connection pad,
the second substrate includes a second connection part with at least one second connection pad, and
the first and second connection parts overlap each other on the first package to electrically connect the at least one first connection pad and the at least one second connection pad.

6. The semiconductor package of claim 1, wherein the first and second semiconductor chips are connected to the first and second substrates via bonding wires.

7. The semiconductor package of claim 1, wherein the second substrate is bent toward the first package to cover at least a portion of a bottom of the first package.

8. A package module comprising:
the semiconductor package of claim 1.

9. A semiconductor package, comprising:
a first package including at least one first semiconductor chip on a first substrate; and
a second package including at least one second semiconductor chip on a second substrate, wherein the first substrate is bent upward to cover a side of the first package and the second substrate is bent downward to cover the side of the first package to electrically connect the first and second packages.

10. The semiconductor package of claim 9, wherein the first and second substrates are flexible printed circuit boards.

11. A semiconductor package, comprising:
a first package including at least one first semiconductor chip on a first substrate; and
a second package including at least one second semiconductor chip on a second substrate, wherein the second substrate is bent toward the first package to cover a side of the first package to electrically connect the first and second packages,
wherein the first substrate includes a first connection part with at least one first connection pad, the second substrate includes a second connection part with at least one second connection pad, and the first and second connection parts overlap each other on the first package to electrically connect the at least one first connection pad and the at least one second connection pad, and
wherein the first and second connection parts overlap each other along the side of the first package.

12. The semiconductor package of claim 11, further comprising:
first external connection terminals on the first substrate; and
second external connection terminals on the second substrate.

13. The semiconductor package of claim 12, wherein the second external connection terminals are on a portion of the second connection part corresponding to the side of the first package.

* * * * *